United States Patent
Song et al.

(10) Patent No.: US 10,637,471 B1
(45) Date of Patent: Apr. 28, 2020

(54) TERMINATION CIRCUIT AND SEMICONDUCTOR APPARATUS INCLUDING THE TERMINATION CIRCUIT

(71) Applicant: SK hynix Inc., Icheon-si, Gyeonggi-do (KR)

(72) Inventors: Jun Yong Song, Seoul (KR); Han Kyu Chi, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/440,383

(22) Filed: Jun. 13, 2019

(30) Foreign Application Priority Data

Nov. 5, 2018 (KR) .......................... 10-2018-0134503

(51) Int. Cl.
*H03K 19/00* (2006.01)
*H03K 17/687* (2006.01)

(52) U.S. Cl.
CPC ....... *H03K 19/0005* (2013.01); *H03K 17/687* (2013.01)

(58) Field of Classification Search
CPC .......................... H03K 19/0005; H03K 17/687

USPC ......................................................... 326/30
See application file for complete search history.

(56) References Cited

U.S. PATENT DOCUMENTS

| 7,196,567 | B2 * | 3/2007 | Nguyen | ..................... H03F 1/56 327/308 |
| 7,595,656 | B2 * | 9/2009 | Hayami | ............. H03K 19/0005 326/26 |
| 8,547,761 | B2 | 10/2013 | Kim et al. | |
| 2008/0112246 | A1 * | 5/2008 | Mei | ....................... G11C 7/1051 365/210.1 |
| 2017/0346466 | A1 * | 11/2017 | Jung | .................. H03K 19/0005 |

* cited by examiner

*Primary Examiner* — Daniel D Chang
(74) *Attorney, Agent, or Firm* — William Park & Associates Ltd.

(57) ABSTRACT

A semiconductor apparatus includes a termination voltage terminal, a first pin, a second pin, a first termination circuit and a second termination circuit. The first termination circuit is coupled between the termination voltage terminal and the first pin. The second termination circuit is coupled between the termination voltage terminal and a second pin. Resistance values of the first termination circuit and the second termination circuit may be determined on a basis of distances from the termination voltage terminal to the first pin and the second pin.

18 Claims, 6 Drawing Sheets

TERMINATION CIRCUIT AND SEMICONDUCTOR APPARATUS INCLUDING THE TERMINATION CIRCUIT

CROSS-REFERENCES TO RELATED APPLICATION

The present application claims priority under 35 U.S.C. § 119(a) to Korean application number 10-2018-0134503, filed on Nov. 5, 2018, in the Korean Intellectual Property Office, which is incorporated herein by reference in its entirety as set forth in full.

BACKGROUND

1. Technical Field

Various embodiments of the present disclosure generally relate to an integrated circuit technology and, more particularly, to a semiconductor memory apparatus and termination circuit.

2. Related Art

An electronic device includes a lot of electronic elements, and a computer system includes lots of electronic components each comprising a semiconductor. Semiconductor apparatuses configuring a computer system may communicate with each other by transmitting and receiving a clock signal and data. The semiconductor apparatuses operate in synchronization with a clock signal. The semiconductor apparatuses may communicate with each other through a transmission line coupled thereto such as a bus, a link or a channel.

As an operation speed of a semiconductor system increases, a pulse width and an amplitude of a signal, which is transmitted through the signal transmission line, lessens. Under such environment, reflection of the signal transmission line and a cross-talk, which occurs between signal transmission lines, make precise transmission and reception of a signal even harder. As is well known, one of schemes to reduce the reflection is to match an impedance of a transmission end transmitting a signal with an impedance of a reception end receiving the signal. The impedance matching of a semiconductor apparatus is generally made through a termination circuit. A scheme of providing the termination circuit into a chip or a die for the impedance matching is referred to as 'on die termination'.

SUMMARY

In an embodiment of the present disclosure, a semiconductor apparatus may include a termination voltage terminal, a first termination circuit, and a second termination circuit. The first termination circuit may be coupled between the termination voltage terminal and a first pin. The second termination circuit may be coupled between the termination voltage terminal and a second pin. Resistance values of the first termination circuit and the second termination circuit may be determined on a basis of distances from the termination voltage terminal to the first pin and the second pin.

In an embodiment of the present disclosure, a semiconductor apparatus may include a termination voltage terminal, a plurality of pins, and a plurality of termination circuits. The plurality of pins may be disposed as sequentially farther from the termination voltage terminal. The plurality of termination circuits may be coupled between the termination voltage terminal and the plurality of pins in a one-to-one manner. The plurality of termination circuits may have different resistance values based on distances from the termination voltage terminal to the plurality of pins.

In an embodiment of the present disclosure, a semiconductor apparatus may include a first termination voltage terminal, a second termination voltage terminal, a first pull-up termination circuit, a first pull-down termination circuit, a second pull-up termination circuit, and a second pull-down termination circuit. The first termination voltage terminal may be configured to receive a first power voltage. The second termination voltage terminal may be configured to receive a second power voltage having a lower level than the first power voltage. The first pull-up termination circuit may be coupled between the first termination voltage terminal and a first pin and having a resistance value varying based on a first pull-up compensation signal. The first pull-down termination circuit may be coupled between the second termination voltage terminal and the first pin and having a resistance value varying based on a first pull-down compensation signal. The second pull-up termination circuit may be coupled between the first termination voltage terminal and a second pin and having a resistance value varying based on a second pull-up compensation signal. The second pull-down termination circuit may be coupled between the second termination voltage terminal and the second pin and having a resistance value varying based on a second pull-down compensation signal.

DETAILED DESCRIPTION

Hereinafter, a semiconductor apparatus according to the present disclosure will be described below with reference to the accompanying drawings through various embodiments.

Figure 1:
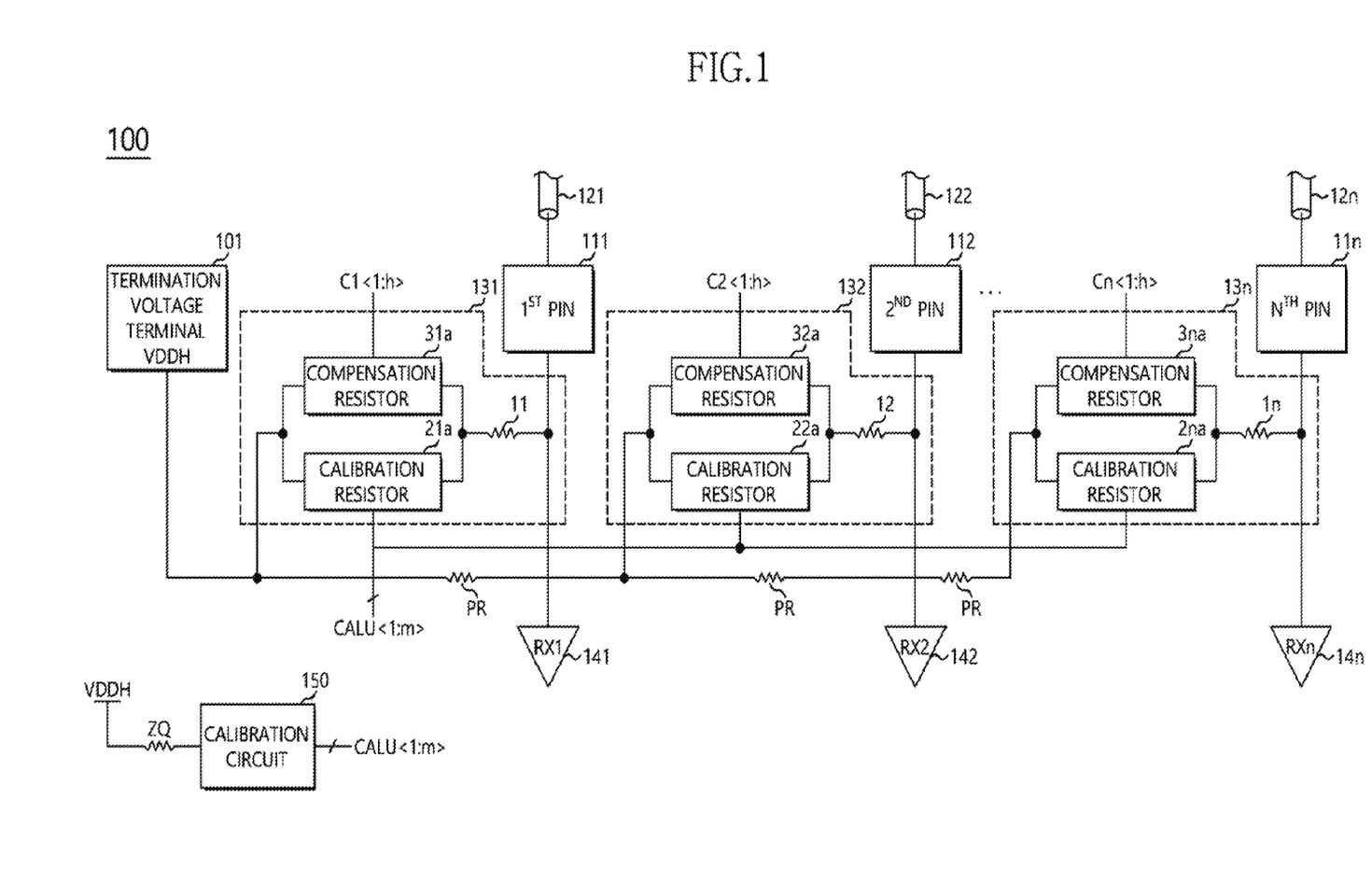
FIG. 1 is a diagram illustrating a configuration of a semiconductor apparatus in accordance with an embodiment of the present disclosure.

FIG. 1 is a diagram illustrating a configuration of a semiconductor apparatus 100 in accordance with an embodiment of the present disclosure. Referring to FIG. 1, the semiconductor apparatus 100 may include a termination voltage terminal 101 and at least two pins. Referring to FIG. 1, for example, first to nth pins 111, 112 and 11n, which will not limit a number of the pins. "n" may be 3 or a greater integer. The termination voltage terminal 101 may receive a voltage having a level corresponding a termination voltage. The semiconductor apparatus 100 may operate by receiving a first power voltage VDDH and a second power voltage. The first power voltage VDDH may have higher level than the second power voltage. For example, the second power voltage may have a level corresponding to a ground voltage. The termination voltage may correspond to the first power voltage VDDH. The termination voltage terminal 101 may be coupled to each of the first to nth pins 111, 112 and 11n and may provide the first power voltage VDDH to each of the first to nth pins 111, 112 and 11n. The semiconductor apparatus 100 may make the first to nth pins 111, 112 and 11n terminated through a scheme of 'High Tapped Termination'.

The first to nth pins 111, 112 and 11n may be arranged as sequentially farther from the termination voltage terminal 101. Among the first to nth pins 111, 112 and 11n, the first pin 111 may be arranged as closest to the termination voltage terminal 101 and the nth pin 11n may be arranged as farthest from the termination voltage terminal 101. The first to nth pins 111, 112 and 11n may be coupled to an external apparatus through a bus and may receive a signal provided from an external apparatus through the bus. The bus may include a plurality of signal transmission lines. The first pin 111 may be coupled to a first signal transmission line 121 and may receive a signal transferred through the first signal transmission line 121. The second pin 112 may be coupled to a second signal transmission line 122 and may receive a signal transferred through the second signal transmission line 122. The nth pin 11n may be coupled to a nth signal transmission line 12n and may receive a signal transferred through the nth signal transmission line 12n. Signals provided to the first to nth pins 111, 112 and 11n through the first to nth signal transmission lines 121, 122 and 12n may have the same characteristics and/or may be of the same type. For example, signals of n bits for the same purpose may be provided through the bus and the signals of n bits may be provided to the first to nth pins 111, 112 and 11n respectively through the first to nth signal transmission lines 121, 122 and 12n. In an embodiment, a plurality of pins may be coupled to a plurality of signal transmission lines in a one-to-one manner whereby a single pin is coupled to a single signal transmission line.

The semiconductor apparatus 100 may include a plurality of termination circuits. The plurality of termination circuits may be coupled respectively between the first to nth pins 111, 112 and 11n and the termination voltage terminal 101. In an embodiment, the plurality of termination circuits are coupled between the termination voltage terminal 101 and the first to nth pins in a one-to-one manner whereby a single termination circuit is coupled between the termination voltage terminal 101 and a single pin. A first termination circuit 131 may be coupled between the first pin 111 and the termination voltage terminal 101. A second termination circuit 132 may be coupled between the second pin 112 and the termination voltage terminal 101. A nth termination circuit 13n may be coupled between the nth pin 11n and the termination voltage terminal 101. The first to nth termination circuits 131, 132 and 13n may be provided for impedance matching between the first to nth pins 111, 112 and 11n and an external apparatus coupled to the first to nth pins 111, 112 and 11n through the first to nth signal transmission lines 121, 122 and 12n. The first to nth termination circuits 131, 132 and 13n may be set to have different resistance values. The resistance values of the first to nth termination circuits 131, 132 and 13n may be determined on a basis of distances from the termination voltage terminal 101 to the first to nth pins 111, 112 and 11n, respectively. For example, a termination circuit coupled to a pin arranged closer to the termination voltage terminal 101 may be set to have a relatively greater resistance value while a termination circuit coupled to a pin arranged farther from the termination voltage terminal 101 may be set to have a relatively less resistance value. For example, the first termination circuit 131 coupled to the first pin 111 may be set to have the greatest resistance value while the nth termination circuit 13n coupled to the nth pin 11n may be set to have the least resistance value.

Each of the plurality of termination circuits may have a reference resistor, a calibration resistor and a compensation resistor. The first termination circuit 131 may have a reference resistor 11, a calibration resistor 21a and a compensation resistor 31a. The reference resistor 11 may be serially coupled to the first pin 111. The calibration resistor 21a and the compensation resistor 31a may be coupled to each other in parallel, and may be serially coupled to the reference resistor 11. The calibration resistor 21a and the compensation resistor 31a may be serially coupled to the termination voltage terminal 101. In an embodiment, the reference resistor 11 may be coupled to the termination voltage terminal 101 and the calibration resistor 21a and the compensation resistor 31a may be coupled to the first pin 111. The reference resistor 11 may have a fixed resistance value. The calibration resistor 21a may receive a calibration code CALU<1:m> (m is 3 or a greater integer). The calibration resistor 21a may have a variable resistance value varying according to the calibration code CALU<1:m>. The calibration code CALU<1:m> may be generated through a calibration operation performed when the semiconductor apparatus 100 is coupled to an external resistor ZQ. The compensation resistor 31a may receive a first compensation signal C1<1:h> (h is 3 or a greater integer). The first compensation signal C1<1:h> may be a multi-bit code signal. The compensation resistor 31a may have a variable resistance value varying according to the first compensation signal C1<1:h>.

The second termination circuit 132 may have a reference resistor 12, a calibration resistor 22a and a compensation resistor 32a. The reference resistor 12 may be serially coupled to the second pin 112. The calibration resistor 22a and the compensation resistor 32a may be coupled to each other in parallel, and may be serially coupled to the reference resistor 12. The calibration resistor 22a and the compensation resistor 32a may be serially coupled to the termination voltage terminal 101. The reference resistor 12 may have a fixed resistance value. The calibration resistor 22a may receive the calibration code CALU<1:m>. The calibration resistor 22a may have a variable resistance value varying according to the calibration code CALU<1:m>. The compensation resistor 32a may receive a second compensation signal C2<1:h>. The second compensation signal C2<1:h> may be a multi-bit code signal. The compensation resistor 32a may have a variable resistance value varying according to the second compensation signal C2<1:h>.

The nth termination circuit 13n may have a reference resistor 1n, a calibration resistor 2na and a compensation resistor 3na. The reference resistor 1n may be serially coupled to the nth pin 11n. The calibration resistor 2na and the compensation resistor 3na may be coupled to each other in parallel, and may be serially coupled to the reference resistor 1n. The calibration resistor 2na and the compensation resistor 3na may be serially coupled to the termination voltage terminal 101. The reference resistor 1n may have a fixed resistance value. The calibration resistor 2na may receive the calibration code CALU<1:m>. The calibration resistor 2na may have a variable resistance value varying according to the calibration code CALU<1:m>. The compensation resistor 3na may receive a nth compensation signal Cn<1:h>. The nth compensation signal Cn<1:h> may be a multi-bit code signal. The compensation resistor 3na may have a variable resistance value varying according to the nth compensation signal Cn<1:h>.

The reference resistors 11, 12 and 1n of the first to nth termination circuits 131, 132 and 13n may have substantially the same resistance value to each other. The calibration resistors 21a, 22a and 2na of the first to nth termination circuits 131, 132 and 13n may have substantially the same resistance value to each other because the calibration resistors 21a, 22a and 2na receive the calibration code CALU<1:m> in common. The compensation resistors 31a, 32a and 3na of the first to nth termination circuits 131, 132 and 13n may have different resistance values from each other because the compensation resistors 31a, 32a and 3na are set to have their resistance values based on different compensation signals. A resistance value of a compensation resistor coupled to a pin arranged closer to the termination voltage terminal 101 may have a greater resistance value while a resistance value of a compensation resistor coupled to a pin arranged farther from the termination voltage terminal 101 may have a less resistance value. The compensation resistor 31a of the first termination circuit 131 may have the greatest resistance value and the compensation resistor 32a of the second termination circuit 132 may have a less resistance value than the compensation resistor 31a of the first termination circuit 131. The compensation resistor 3na of the nth termination circuit 13n may have the least resistance value. Because the compensation resistors 31a, 32a and 3na are set to have different resistance values, the first to nth termination circuits 131, 132 and 13n may be set to have different resistance values.

The first to nth termination circuits 131, 132 and 13n may set termination resistance values of the first to nth pins 111, 112 and 11n and the signals provided through the first to nth pins 111, 112 and 11n may have substantially the same characteristics, and therefore, in general, the first to nth termination circuits 131, 132 and 13n may be supposed to be set to have substantially the same resistance value. However, the first to nth pins 111, 112 and 11n may be arranged to have different distance from the termination voltage terminal 101 and therefore there may be formed different parasitic resistors between the first to nth pins 111, 112 and 11n and the termination voltage terminal 101. Accordingly, when the first to nth termination circuits 131, 132 and 13n are set to have substantially the same resistance value, resistance values formed between the termination voltage terminal 101 and the first to nth pins 111, 112 and 11n may be different from each other. Because the first pin 111 is arranged closest to the termination voltage terminal 101, a parasitic resistor might not be formed or may be formed to have a negligibly small resistance value between the termination voltage terminal 101 and the first pin 111. Because the second pin 112 is arranged farther than the first pin 111 from the termination voltage terminal 101, a parasitic resistor may be formed between the termination voltage terminal 101 and the second pin 112. Because the nth pin 11n is arranged farthest from the termination voltage terminal 101, a parasitic resistor may be formed to have a greatest resistance value between the termination voltage terminal 101 and the nth pin 11n. When the first to nth pins 111, 112 and 11n are arranged as sequentially farther from the termination voltage terminal 101 at the same interval between neighbouring ones among the first to nth pins 111, 112 and 11n, the parasitic resistance value between the second pin 112 and the termination voltage terminal 101 may be '1*PR' and the parasitic resistance value between the nth pin 11n and the termination voltage terminal 101 may be '(n−1)*PR'. Therefore, when the first to nth termination circuits 131, 132 and 13n are set to have substantially the same resistance value, resistance values formed between the termination voltage terminal 101 and the first to nth pins 111, 112 and 11n may be different from each other due to the parasitic resistors. In accordance with an embodiment of the present disclosure, the resistance values formed between the termination voltage terminal 101 and the first to nth pins 111, 112 and 11n may be made as the same as each other by setting different resistance values of the compensation resistors 31a, 32a and 3na based on the distances from the termination voltage terminal 101 to the first to nth pins 111, 112 and 11n.

A composite resistance value of resistors among the termination voltage terminal 101, the first termination circuit 131 and the first pin 111 may become substantially the same as a composite resistance value of resistors among the termination voltage terminal 101, the second termination circuit 132 and the second pin 112. The composite resistance value of resistors among the termination voltage terminal 101, the second termination circuit 132 and the second pin 112 may become substantially the same as a composite resistance value of resistors among the termination voltage terminal 101, the nth termination circuit 13n and the nth pin 11n. The composite resistance value of resistors formed among the termination voltage terminal 101, the nth termination circuit 13n and the nth pin 11n may become substantially the same as the composite resistance value of resistors formed among the termination voltage terminal 101, the first termination circuit 131 and the first pin 111.

It is assumed that the resistance value of the compensation resistor 31a of the first termination circuit 131 is 'Rcom1', the resistance value of the compensation resistor 32a of the second termination circuit 132 is 'Rcom2' and the resistance value of the compensation resistor 3na of the nth termination circuit 13n is 'Rcomn'. When the resistance value of the respective first to nth pins 111, 112 and 11n is 'Rref' and the resistance value of the respective calibration resistors 21a, 22a and 2na is 'Rcal', the resistance value between the termination voltage terminal 101 and the first pin 111 may be '(Rcom1//Rcal)+Rref', the resistance value between the termination voltage terminal 101 and the second pin 112 may be 'PR+(Rcom2//Rcal)+Rref' and the resistance value between the termination voltage terminal 101 and the nth pin 11n may be '(n−1)*PR+(Rcom3//Rcal)+Rref'. Because the reference resistors 11, 12 and 11n have substantially the same resistance value and the calibration resistors 21a, 22a and 2na have substantially the same resistance value, the resistance values of the first to nth termination circuits 131, 132 and 13n may depend on the resistance values '1*PR' and '(n−1)*PR' of the parasitic resistors and the resistance values 'Rcom1', 'Rcom2' and 'Rcomn' of the compensation resistors 31a, 32a and 3na. The resistance value of the compensation resistor 31a of the first termination circuit 131 may be determined based on the first compensation signal C1<1:h> such that the resistance value '(Rcom1//Rcal)+Rref' between the termination voltage terminal 101 and the first pin 111 is the same as the resistance value 'PR+(Rcom2//Rcal)+Rref' between the termination voltage terminal 101 and the second pin 112 and/or the resistance value '(n−1)*PR+(Rcom3//Rcal)+Rref' between the termination voltage terminal 101 and the nth pin 11n. The resistance value of the compensation resistor 32a of the second termination circuit 132 may be determined based on the second compensation signal C2<1:h> such that the resistance value 'PR+(Rcom2//Rcal)+Rref' between the termination voltage terminal 101 and the second pin 112 is the same as the resistance value '(n−1)*PR+(Rcom3//Rcal)+Rref' between the termination voltage terminal 101 and the nth pin 11n and/or the resistance value '(Rcom1//Rcal)+Rref' between the termination voltage terminal 101 and the first pin 111. The resistance value of the compensation resistor 3na of the nth termination circuit 13n may be determined based on the nth compensation signal Cn<1:h> such that the resistance value '(n−1)*PR+(Rcom3//Rcal)+Rref' between the termination voltage terminal 101 and the nth pin 11n is the same as the resistance value '(Rcom1//Rcal)+Rref' between the termination voltage terminal 101 and the first pin 111 and/or the resistance value 'PR+(Rcom2//Rcal)+Rref' between the termination voltage terminal 101 and the second pin 112.

Referring to FIG. 1, the semiconductor apparatus 100 may further include a first receiver (RX1) 141, a second receiver (RX2) 142 and a nth receiver (RXn) 14n. The first receiver 141 may be coupled to the first pin 111 and may receive a signal transferred through the first signal transmission line 121 and the first pin 111. The second receiver 142 may be coupled to the second pin 112 and may receive a signal transferred through the second signal transmission line 122 and the second pin 112. The nth receiver 14n may be coupled to the nth pin 11n and may receive a signal transferred through the nth signal transmission line 12n and the nth pin 11n. The signals received by the first to nth receivers 141, 142 and 14n may be provided to internal circuits (not illustrated) of the semiconductor apparatus 100.

The semiconductor apparatus 100 may further include a calibration circuit 150. The calibration circuit 150 may perform a calibration operation while being coupled to an external reference resistor ZQ. The calibration circuit 150 may generate the calibration code CALU<1:m> by performing the calibration operation. For example, the calibration code CALU<1:m> may be a signal for setting a pull-up resistance value.

Figure 2:
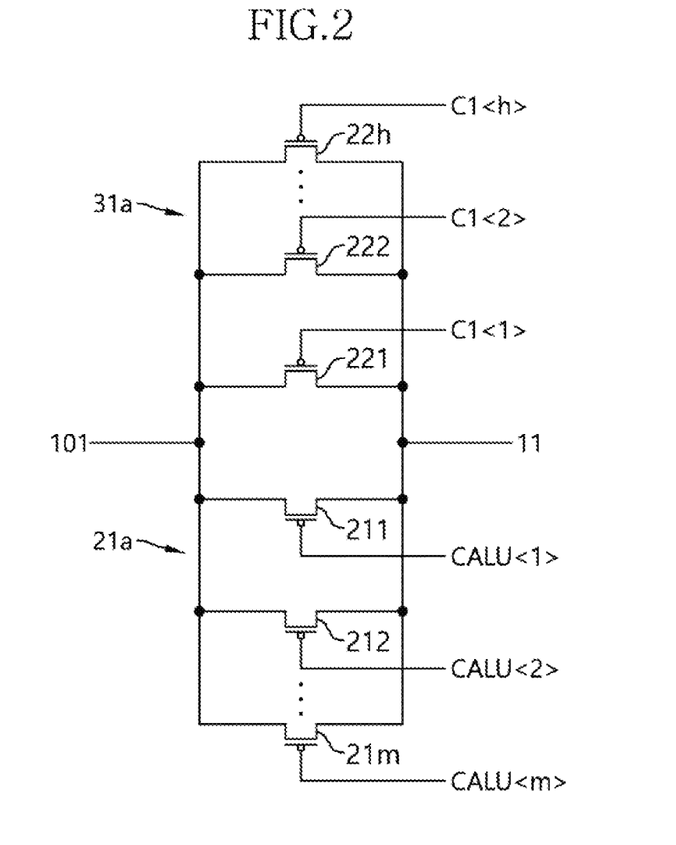
FIG. 2 is a diagram illustrating a configuration of a calibration resistor and a compensation resistor within a first termination circuit shown in FIG. 1.

FIG. 2 is a diagram illustrating a configuration of the calibration resistor 21a and the compensation resistor 31a within the first termination circuit 131 shown in FIG. 1. Referring to FIG. 2, the calibration resistor 21a may include a plurality of transistors coupled to each other in parallel between the termination voltage terminal 101 and the reference resistor 11. Each of the plurality of transistors may be a P-channel MOS transistor. The compensation resistor 31a may include a plurality of transistors coupled to each other in parallel between the termination voltage terminal 101 and the reference resistor 11. Each of the plurality of transistors may be a P-channel MOS transistor. The termination of the first to nth pins 111, 112 and 11n may be made through a scheme of 'High Tapped Termination', and therefore a P-channel MOS transistor suitable for providing a high-level voltage may be desirable as the calibration resistor 21a and the compensation resistor 31a.

The calibration resistor 21a may include 'm' number of transistors, 'm' corresponding to a number of bits of the calibration code CALU<1:m>. A first transistor 211 may receive a first bit CALU<1> of the calibration code CALU<1:m> at its gate, may be coupled to the termination voltage terminal 101 at its source and may be coupled to the reference resistor 11 at its drain. A second transistor 212 may receive a second bit CALU<2> of the calibration code CALU<1:m> at its gate, may be coupled to the termination voltage terminal 101 at its source and may be coupled to the reference resistor 11 at its drain. A mth transistor 21m may receive a mth bit CALU<m> of the calibration code CALU<1:m> at its gate, may be coupled to the termination voltage terminal 101 at its source and may be coupled to the reference resistor 11 at its drain.

The compensation resistor 31a may include 'h' number of transistors, 'h' corresponding to a number of bits of the first compensation signal C1<1:h>. A first transistor 221 may receive a first bit C1<1> of the first compensation signal C1<1:h> at its gate, may be coupled to the termination voltage terminal 101 at its source and may be coupled to the reference resistor 11 at its drain. A second transistor 222 may receive a second bit C1<2> of the first compensation signal C1<1:h> at its gate, may be coupled to the termination voltage terminal 101 at its source and may be coupled to the reference resistor 11 at its drain. A hth transistor 22h may receive a hth bit C1<h> of the first compensation signal C1<1:h> at its gate, may be coupled to the termination voltage terminal 101 at its source and may be coupled to the reference resistor 11 at its drain. Each of the calibration resistors 22a and 2na of the second termination circuit 132 and the nth termination circuit 13n may have the same structure as the calibration resistor 21a. Each of the compensation resistors 32a and 3na of the second termination circuit 132 and the nth termination circuit 13n may have the same structure as the compensation resistor 31a except that the compensation resistors 32a and 3na may receive the second compensation signal C2<1:h> and the nth compensation signal Cn<1:h> respectively assigned thereto.

The first to mth transistors 211, 212 and 21m may have the same turn-on resistance value or at least one among the first to mth transistors 211, 212 and 21m may have a different turn-on resistance value. The first to hth transistors 221, 222 and 22m may have the same turn-on resistance value or at least one among the first to mth transistors 211, 212 and 21m may have a different turn-on resistance value. The first to nth compensation signals C1<1:h>, C2<1:h> and Cn<1:h> may be generated in various ways and control signals of any kind may be used as the first to nth compensation signals C1<1:h>, C2<1:h> and Cn<1:h>. The first to nth compensation signals C1<1:h>, C2<1:h> and Cn<1:h> may be generated on the basis of a control signal provided from an external apparatus of the semiconductor apparatus 100. The first to nth compensation signals C1<1:h>, C2<1:h> and Cn<1:h> may be generated by utilizing information stored in a register within the semiconductor apparatus 100.

Figure 3:
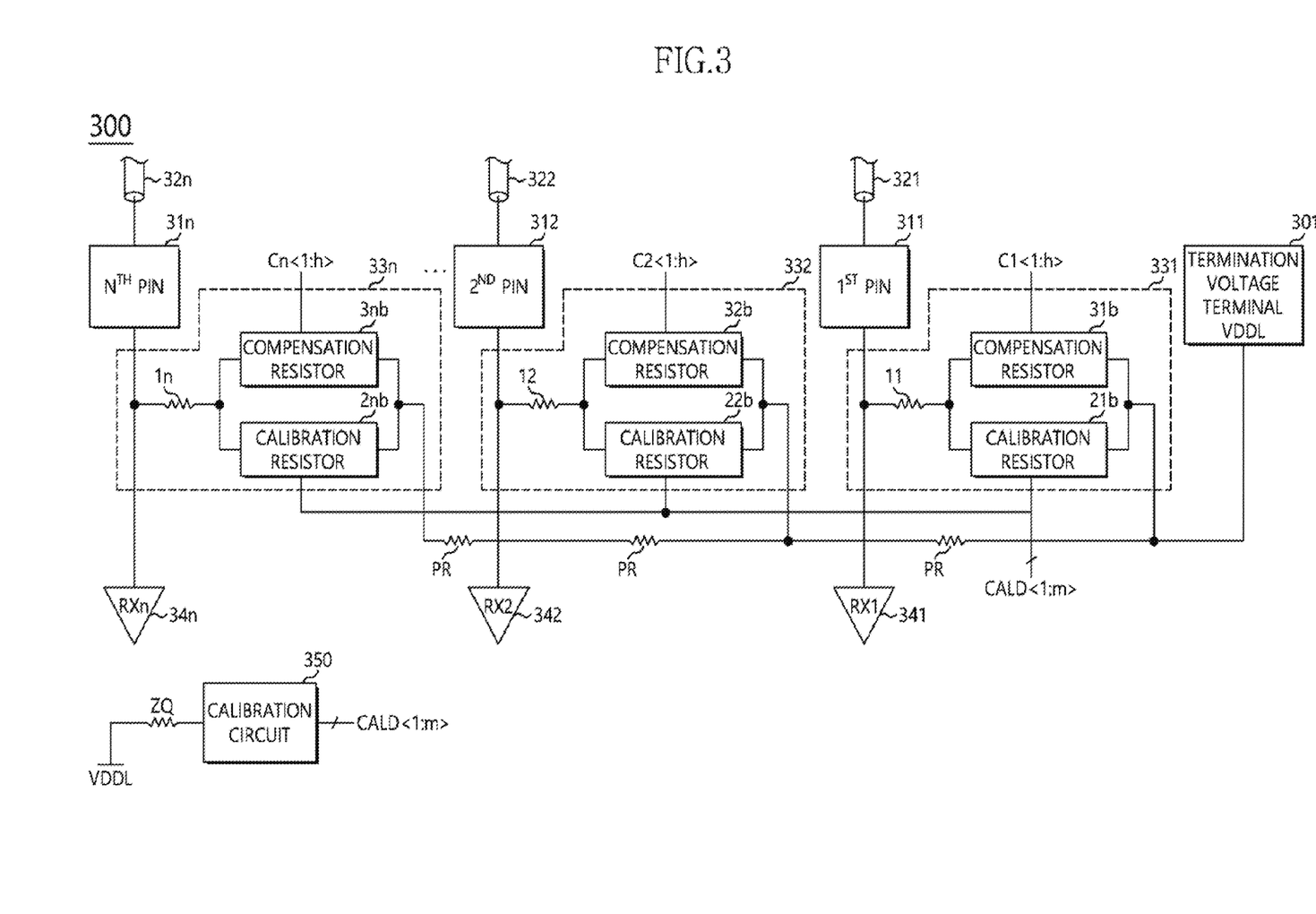
FIG. 3 is a diagram illustrating a configuration of a semiconductor apparatus in accordance with an embodiment of the present disclosure.

FIG. 3 is a diagram illustrating a configuration of a semiconductor apparatus 300 in accordance with an embodiment of the present disclosure. Referring to FIG. 3, the semiconductor apparatus 300 may include a termination voltage terminal 301 and at least two pins. Referring to FIG. 3, for example, first to nth pins 311, 312 and 31n. "n" may be 3 or a greater integer. The termination voltage terminal 301 may receive a voltage having a level corresponding a termination voltage. The termination voltage may correspond to the second power voltage VDDL. The termination voltage terminal 301 may be coupled to each of the first to nth pins 311, 312 and 31n and may provide the second power voltage VDDL to each of the first to nth pins 311, 312 and 31n. The semiconductor apparatus 300 may make the first to nth pins 311, 312 and 31n terminated through a scheme of 'Low Tapped Termination'.

The first to nth pins 311, 312 and 31n may be arranged as sequentially farther from the termination voltage terminal 301. Among the first to nth pins 311, 312 and 31n, the first pin 311 may be arranged as closest to the termination voltage terminal 301 and the nth pin 31n may be arranged as farthest from the termination voltage terminal 301. The first to nth pins 311, 312 and 31n may be coupled to an external apparatus through a bus and may receive a signal provided from an external apparatus through the bus. The bus may include a plurality of signal transmission lines. The first pin 311 may be coupled to a first signal transmission line 321 and may receive a signal transferred through the first signal transmission line 321. The second pin 312 may be coupled to a second signal transmission line 322 and may receive a signal transferred through the second signal transmission line 322. The nth pin 31n may be coupled to a nth signal transmission line 32n and may receive a signal transferred through the nth signal transmission line 32n. Signals provided to the first to nth pins 311, 312 and 31n through the first to nth signal transmission lines 321, 322 and 32n may have the same characteristics and/or may be of the same type. For example, signals of n bits may be provided through the bus and the signals of n bits may be provided to the first to nth pins 311, 312 and 31n respectively through the first to nth signal transmission lines 321, 322 and 32n.

The semiconductor apparatus 300 may include a plurality of termination circuits. The plurality of termination circuits may be coupled respectively between the first to nth pins 311, 312 and 31n and the termination voltage terminal 301. A first termination circuit 331 may be coupled between the first pin 311 and the termination voltage terminal 301. A second termination circuit 332 may be coupled between the second pin 312 and the termination voltage terminal 301. A nth termination circuit 33n may be coupled between the nth pin 31n and the termination voltage terminal 301. The first to nth termination circuits 331, 332 and 33n may be provided for impedance matching between the first to nth pins 311, 312 and 31n and an external apparatus coupled to the first to nth pins 311, 312 and 31n through the first to nth signal transmission lines 321, 322 and 32n. The first to nth termination circuits 331, 332 and 33n may be set to have different resistance values. The resistance values of the first to nth termination circuits 331, 332 and 33n may be determined on a basis of distances from the termination voltage terminal 301 to the first to nth pins 311, 312 and 31n, respectively. For example, the first termination circuit 331 coupled to the first pin 311 may be set to have the greatest resistance value while the nth termination circuit 33n coupled to the nth pin 31n may be set to have the least resistance value.

Each of the plurality of termination circuits may have a reference resistor, a calibration resistor and a compensation resistor. The first termination circuit 331 may have a reference resistor 11, a calibration resistor 21b and a compensation resistor 31b. The reference resistor 11 may be serially coupled to the first pin 311. The calibration resistor 21b and the compensation resistor 31b may be coupled to each other in parallel, and may be serially coupled to the reference resistor 11. The calibration resistor 21b and the compensation resistor 31b may be serially coupled to the termination voltage terminal 301. In an embodiment, the reference resistor 11 may be coupled to the termination voltage terminal 301 and the calibration resistor 21b and the compensation resistor 31b may be coupled to the first pin 311. The reference resistor 11 may have a fixed resistance value. The calibration resistor 21b may receive a calibration code CALD<1:m>. The calibration resistor 21b may have a variable resistance value varying according to the calibration code CALD<1:m>. The calibration code CALD<1:m> may be generated through a calibration operation performed when the semiconductor apparatus 300 is coupled to an external resistor ZQ. The compensation resistor 31b may receive a first compensation signal C1<1:h>. The first compensation signal C1<1:h> may be a multi-bit code signal. The compensation resistor 31b may have a variable resistance value varying according to the first compensation signal C1<1:h>.

The second termination circuit 332 may have a reference resistor 12, a calibration resistor 22b and a compensation resistor 32b. The reference resistor 12 may be serially coupled to the second pin 312. The calibration resistor 22b and the compensation resistor 32b may be coupled to each other in parallel, and may be serially coupled to the reference resistor 12. The calibration resistor 22b and the compensation resistor 32b may be serially coupled to the termination voltage terminal 301. The reference resistor 12 may have a fixed resistance value. The calibration resistor 22b may receive the calibration code CALD<1:m>. The calibration resistor 22b may have a variable resistance value varying according to the calibration code CALD<1:m>. The compensation resistor 32b may receive a second compensation signal C2<1:h>. The second compensation signal C2<1:h> may be a multi-bit code signal. The compensation resistor 32b may have a variable resistance value varying according to the second compensation signal C2<1:h>.

The nth termination circuit 33n may have a reference resistor 1n, a calibration resistor 2nb and a compensation resistor 3nb. The reference resistor 1n may be serially coupled to the nth pin 31n. The calibration resistor 2nb and the compensation resistor 3nb may be coupled to each other in parallel, and may be serially coupled to the reference resistor 1n. The calibration resistor 2nb and the compensation resistor 3nb may be serially coupled to the termination voltage terminal 301. The reference resistor 1n may have a fixed resistance value. The calibration resistor 2nb may receive the calibration code CALD<1:m>. The calibration resistor 2nb may have a variable resistance value varying according to the calibration code CALD<1:m>. The compensation resistor 3nb may receive a nth compensation signal Cn<1:h>. The nth compensation signal Cn<1:h> may be a multi-bit code signal. The compensation resistor 3nb may have a variable resistance value varying according to the nth compensation signal Cn<1:h>.

The reference resistors 11, 12 and 1n of the first to nth termination circuits 331, 332 and 33n may have substantially the same resistance value to each other. The calibration resistors 21b, 22b and 2nb of the first to nth termination circuits 331, 332 and 33n may have substantially the same resistance value to each other because the calibration resistors 21b, 22b and 2nb receive the calibration code CALD<1:m> in common. The compensation resistors 31b, 32b and 3nb of the first to nth termination circuits 331, 332 and 33n may have different resistance values from each other because the compensation resistors 31b, 32b and 3nb are set to have their resistance values based on different compensation signals. A resistance value of a compensation resistor coupled to a pin arranged closer to the termination voltage terminal 301 may have a greater resistance value while a resistance value of a compensation resistor coupled to a pin arranged farther from the termination voltage terminal 301 may have a less resistance value. The compensation resistor 31b of the first termination circuit 331 may have the greatest resistance value and the compensation resistor 32b of the second termination circuit 332 may have a less resistance value than the compensation resistor 31b of the first termination circuit 331. The compensation resistor 3nb of the nth termination circuit 33n may have the least resistance value. Because the compensation resistors 31b, 32b and 3nb are set to have different resistance values, the first to nth termination circuits 331, 332 and 33n may be set to have different resistance values.

The first to nth termination circuits 331, 332 and 33n may set termination resistance values of the first to nth pins 311, 312 and 31n and the signals provided through the first to nth pins 311, 312 and 31n may have substantially the same characteristics, and therefore, in general, the first to nth termination circuits 331, 332 and 33n may be supposed to be set to have substantially the same resistance value. However, the first to nth pins 311, 312 and 31n may be arranged to have different distance from the termination voltage terminal 301 and therefore there may be formed different parasitic resistors between the first to nth pins 311, 312 and 31n and the termination voltage terminal 301. Because the first pin 311 is arranged closest to the termination voltage terminal 301, a parasitic resistor might not be formed or may be formed to have a negligibly small resistance value between the termination voltage terminal 301 and the first pin 311. Because the second pin 312 is arranged farther than the first pin 311 from the termination voltage terminal 301, a parasitic resistor may be formed between the termination voltage terminal 301 and the second pin 312. Because the nth pin 31n is arranged farthest from the termination voltage terminal 301, a parasitic resistor may be formed to have a greatest resistance value between the termination voltage terminal 301 and the nth pin 31n. When the first to nth pins 311, 312 and 31n are arranged as sequentially farther from the termination voltage terminal 301 at the same interval between neighbouring ones among the first to nth pins 311, 312 and 31n, the parasitic resistance value between the second pin 312 and the termination voltage terminal 301 may be '1*PR' and the parasitic resistance value between the nth pin 31n and the termination voltage terminal 301 may be '(n−1)*PR'. Therefore, when the first to nth termination circuits 331, 332 and 33n are set to have substantially the same resistance value, resistance values formed between the termination voltage terminal 301 and the first to nth pins 311, 312 and 31n may be different from each other due to the parasitic resistors. In accordance with an embodiment of the present disclosure, the resistance values formed between the termination voltage terminal 301 and the first to nth pins 311, 312 and 31n may be made as the same as each other by setting different resistance values of the compensation resistors 31b, 32b and 3nb of the first to nth termination circuits 331, 332 and 33n based on the distances from the termination voltage terminal 301 to the first to nth pins 311, 312 and 31n.

A composite resistance value of resistors among the termination voltage terminal 301, the first termination circuit 331 and the first pin 311 may become substantially the same as a composite resistance value of resistors among the termination voltage terminal 301, the second termination circuit 332 and the second pin 312. The composite resistance value of resistors among the termination voltage terminal 301, the second termination circuit 332 and the second pin 312 may become substantially the same as a composite resistance value of resistors among the termination voltage terminal 301, the nth termination circuit 33n and the nth pin 31n. The composite resistance value of resistors among the termination voltage terminal 301, the nth termination circuit 33n and the nth pin 31n may become substantially the same as the composite resistance value of resistors among the termination voltage terminal 301, the first termination circuit 331 and the first pin 311.

Referring to FIG. 3, the semiconductor apparatus 300 may further include a first receiver (RX1) 341, a second receiver (RX2) 342 and a nth receiver (RXn) 34n. The first receiver 341 may be coupled to the first pin 311 and may receive a signal transferred through the first signal transmission line 321 and the first pin 311. The second receiver 342 may be coupled to the second pin 312 and may receive a signal transferred through the second signal transmission line 322 and the second pin 312. The nth receiver 34n may be coupled to the nth pin 31n and may receive a signal transferred through the nth signal transmission line 32n and the nth pin 31n. The signals received by the first to nth receivers 341, 342 and 34n may be provided to internal circuits (not illustrated) of the semiconductor apparatus 300.

The semiconductor apparatus 300 may further include a calibration circuit 350. The calibration circuit 350 may perform a calibration operation while being coupled to an external reference resistor ZQ. One end of the external reference resistor ZQ may be coupled to the second power voltage VDDL. The calibration circuit 350 may generate the calibration code CALD<1:m> by performing the calibration operation. For example, the calibration code CALD<1:m> may be a signal for setting a pull-down resistance value.

Figure 4:
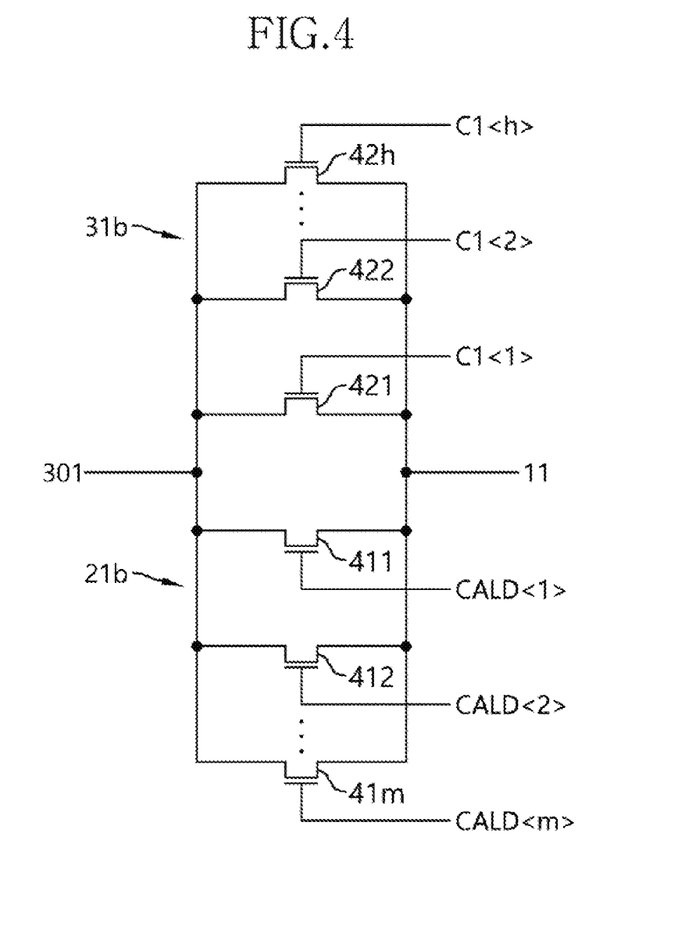
FIG. 4 is a diagram illustrating a configuration of a calibration resistor and a compensation resistor within a first termination circuit shown in FIG. 3.

FIG. 4 is a diagram illustrating a configuration of the calibration resistor 21b and the compensation resistor 31b within the first termination circuit 331 shown in FIG. 3. Referring to FIG. 4, the calibration resistor 21b may include a plurality of transistors coupled to each other in parallel between the termination voltage terminal 301 and the reference resistor 11. Each of the plurality of transistors may be a N-channel MOS transistor. The compensation resistor 31b may include a plurality of transistors coupled to each other in parallel between the termination voltage terminal 301 and the reference resistor 11. Each of the plurality of transistors may be a N-channel MOS transistor. The termination of the first to nth pins 311, 312 and 31n may be made through a scheme of 'Low Tapped Termination', and therefore a N-channel MOS transistor suitable for providing a low-level voltage may be desirable as the calibration resistor 21b and the compensation resistor 31b.

The calibration resistor 21b may include 'm' number of transistors, 'm' corresponding to a number of bits of the calibration code CALD<1:m>. A first transistor 411 may receive a first bit CALD<1> of the calibration code CALD<1:m> at its gate, may be coupled to the termination voltage terminal 301 at its source and may be coupled to the reference resistor 11 at its drain. A second transistor 412 may receive a second bit CALD<2> of the calibration code CALD<1:m> at its gate, may be coupled to the termination voltage terminal 301 at its source and may be coupled to the reference resistor 11 at its drain. A mth transistor 41m may receive a mth bit CALD<m> of the calibration code CALD<1:m> at its gate, may be coupled to the termination voltage terminal 301 at its source and may be coupled to the reference resistor 11 at its drain.

The compensation resistor 31b may include 'h' number of transistors, 'h' corresponding to a number of bits of the first compensation signal C1<1:h>. A first transistor 421 may receive a first bit C1<1> of the first compensation signal C1<1:h> at its gate, may be coupled to the termination voltage terminal 301 at its source and may be coupled to the reference resistor 11 at its drain. A second transistor 422 may receive a second bit C1<2> of the first compensation signal C1<1:h> at its gate, may be coupled to the termination voltage terminal 301 at its source and may be coupled to the reference resistor 11 at its drain. A hth transistor 42h may receive a hth bit C1<h> of the first compensation signal C1<1:h> at its gate, may be coupled to the termination voltage terminal 301 at its source and may be coupled to the reference resistor 11 at its drain. Each of the calibration resistors 22b and 2nb of the second termination circuit 332 and the nth termination circuit 33n may have the same structure as the calibration resistor 21b. Each of the compensation resistors 32b and 3nb of the second termination circuit 332 and the nth termination circuit 33n may have the same structure as the compensation resistor 31b except that the compensation resistors 32b and 3nb may receive the second compensation signal C2<1:h> and the nth compensation signal Cn<1:h> respectively assigned thereto.

Figure 5:
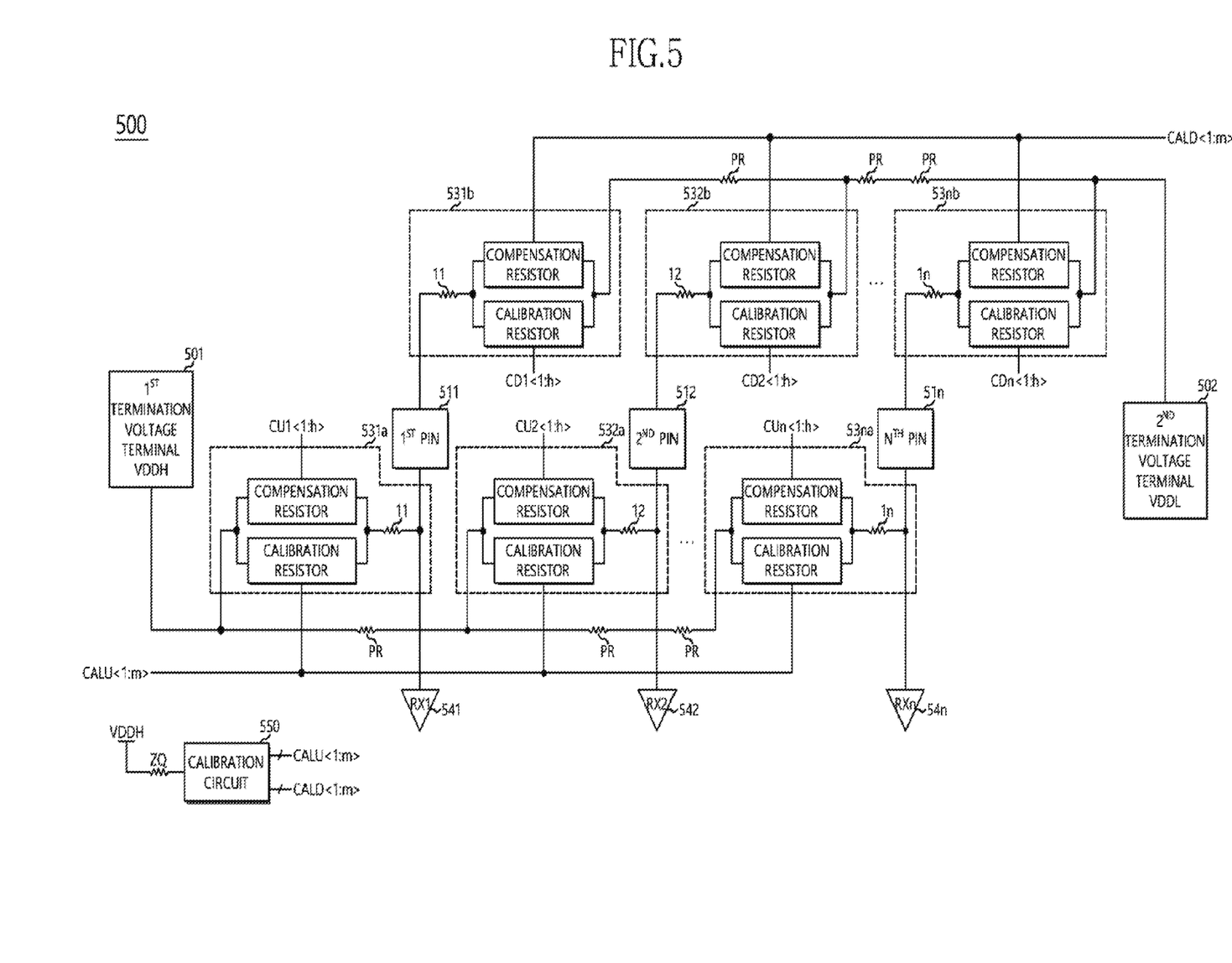
FIG. 5 is a diagram illustrating a configuration of a semiconductor apparatus in accordance with an embodiment of the present disclosure.

FIG. 5 is a diagram illustrating a configuration of a semiconductor apparatus 500 in accordance with an embodiment of the present disclosure. Referring to FIG. 5, the semiconductor apparatus 500 may include a first termination voltage terminal 501, a second termination voltage terminal 502 and at least two pins. FIG. 5 illustrates, for example, first to nth pins 511, 512 and 51n. The first termination voltage terminal 501 may receive a first power voltage VDDH. The second termination voltage terminal 502 may receive a second power voltage VDDL. Each of the first termination voltage terminal 501 and the second termination voltage terminal 502 may be coupled to each of the first to nth pins 511, 512 and 51n and may provide a termination voltage to each of the first to nth pins 511, 512 and 51n. The termination voltage may have a level corresponding to a middle voltage level between the first power voltage VDDH and the second power voltage VDDL. The semiconductor apparatus 100 may make the first to nth pins 511, 512 and 51n terminated through a scheme of 'Center Tapped Termination'.

The first to nth pins 511, 512 and 51n may be arranged as sequentially farther from the first termination voltage terminal 501. Among the first to nth pins 511, 512 and 51n, the first pin 511 may be arranged as closest to the first termination voltage terminal 501 and the nth pin 51n may be arranged as farthest from the first termination voltage terminal 501. The first to nth pins 511, 512 and 51n may be arranged as sequentially farther from the second termination voltage terminal 502. Among the first to nth pins 511, 512 and 51n, the first pin 511 may be arranged as farthest from the second termination voltage terminal 502 and the nth pin 51n may be arranged as closest to the second termination voltage terminal 502.

The semiconductor apparatus 500 may include a plurality of termination circuits. The plurality of termination circuits may be coupled respectively between the first to nth pins 511, 512 and 51n and the first termination voltage terminal 501 and between the first to nth pins 511, 512 and 51n and the second termination voltage terminal 502. A first pull-up termination circuit 531a may be coupled between the first termination voltage terminal 501 and the first pin 511. A first pull-down termination circuit 531b may be coupled between the second termination voltage terminal 502 and the first pin 511. A second pull-up termination circuit 532a may be coupled between the first termination voltage terminal 501 and the second pin 512. A second pull-down termination circuit 532b may be coupled between the second termination voltage terminal 502 and the second pin 512. A nth pull-up termination circuit 53na may be coupled between the first termination voltage terminal 501 and the nth pin 51n. A nth pull-down termination circuit 53nb may be coupled between the second termination voltage terminal 502 and the nth pin 51n.

The first to nth pull-up termination circuits 531a, 532a and 53na and the first to nth pull-down termination circuits 531b, 532b and 53nb may be provided for impedance matching between the first to nth pins 511, 512 and 51n and an external apparatus coupled to the first to nth pins 511, 512 and 51n. The first to nth pull-up termination circuits 531a, 532a and 53na may be set to have different resistance values. The resistance values of the first to nth pull-up termination circuits 531a, 532a and 53na may be determined on a basis of distances from the first termination voltage terminal 501 to the first to nth pins 511, 512 and 51n, respectively. For example, a pull-up termination circuit coupled to a pin arranged closer to the first termination voltage terminal 501 may be set to have a relatively greater resistance value while a pull-up termination circuit coupled to a pin arranged farther from the first termination voltage terminal 501 may be set to have a relatively less resistance value. For example, the first pull-up termination circuit 531a coupled to the first pin 511 may be set to have the greatest resistance value while the nth pull-up termination circuit 53na coupled to the nth pin 51n may be set to have the least resistance value.

The first to nth pull-down termination circuits 531b, 532b and 53nb may be set to have different resistance values. The resistance values of the first to nth pull-down termination circuits 531b, 532b and 53nb may be determined on a basis of distances from the second termination voltage terminal 502 to the first to nth pins 511, 512 and 51n, respectively. For example, a pull-down termination circuit coupled to a pin arranged closer to the second termination voltage terminal 502 may be set to have a relatively greater resistance value while a pull-down termination circuit coupled to a pin arranged farther from the first termination voltage terminal 501 may be set to have a relatively less resistance value. For example, the first pull-down termination circuit 531b coupled to the first pin 511 may be set to have the least resistance value while the nth pull-down termination circuit 53nb coupled to the nth pin 51n may be set to have the greatest resistance value.

Each of the first to nth pull-up termination circuits 531a, 532a and 53na may have a reference resistor, a calibration resistor and a compensation resistor. The first pull-up termination circuit 531a may have a reference resistor 11, a calibration resistor and a compensation resistor. The reference resistor 11 of the first pull-up termination circuit 531a may be serially coupled to the first pin 511. The calibration resistor and the compensation resistor of the first pull-up termination circuit 531a may be coupled to each other in parallel, and may be serially coupled to the reference resistor 11. The calibration resistor and the compensation resistor of the first pull-up termination circuit 531a may be serially coupled to the first termination voltage terminal 501. The calibration resistor of the first pull-up termination circuit 531a may receive a pull-up calibration code CALU<1:m>. The calibration resistor of the first pull-up termination circuit 531a may have a variable resistance value varying according to the pull-up calibration code CALU<1:m>. The compensation resistor of the first pull-up termination circuit 531a may receive a first pull-up compensation signal CU1<1:h>. The first pull-up compensation signal CU1<1:h> may be a multi-bit code signal. The compensation resistor of the first pull-up termination circuit 531a may have a variable resistance value varying according to the first pull-up compensation signal CU1<1:h>.

The second pull-up termination circuit 532a may have a reference resistor 12, a calibration resistor and a compensation resistor. The reference resistor 12 of the second pull-up termination circuit 532a may be serially coupled to the second pin 512. The calibration resistor and the compensation resistor of the second pull-up termination circuit 532a may be coupled to each other in parallel, and may be serially coupled to the reference resistor 12. The calibration resistor and the compensation resistor of the second pull-up termination circuit 532a may be serially coupled to the first termination voltage terminal 501. The calibration resistor of the second pull-up termination circuit 532a may receive the pull-up calibration code CALU<1:m>. The calibration resistor of the second pull-up termination circuit 532a may have a variable resistance value varying according to the pull-up calibration code CALU<1:m>. The compensation resistor of the second pull-up termination circuit 532a may receive a second pull-up compensation signal CU2<1:h>. The second pull-up compensation signal CU2<1:h> may be a multi-bit code signal. The compensation resistor of the second pull-up termination circuit 532a may have a variable resistance value varying according to the second pull-up compensation signal CU2<1:h>.

The nth pull-up termination circuit 53na may have a reference resistor 1n, a calibration resistor and a compensation resistor. The reference resistor 1n of the nth pull-up termination circuit 53na may be serially coupled to the nth pin 51n. The calibration resistor and the compensation resistor of the nth pull-up termination circuit 53na may be coupled to each other in parallel, and may be serially coupled to the reference resistor 1n. The calibration resistor and the compensation resistor of the nth pull-up termination circuit 53na may be serially coupled to the first termination voltage terminal 501. The calibration resistor of the nth pull-up termination circuit 53na may receive the pull-up calibration code CALU<1:m>. The calibration resistor of the nth pull-up termination circuit 53na may have a variable resistance value varying according to the pull-up calibration code CALU<1:m>. The compensation resistor of the nth pull-up termination circuit 53na may receive a nth pull-up compensation signal CUn<1:h>. The nth pull-up compensation signal CUn<1:h> may be a multi-bit code signal. The compensation resistor of the nth pull-up termination circuit 53na may have a variable resistance value varying according to the nth pull-up compensation signal CUn<1:h>.

The reference resistors 11, 12 and 11n of the first to nth pull-up termination circuits 531a, 532a and 53na may have substantially the same resistance value to each other. The calibration resistors of the first to nth pull-up termination circuits 531a, 532a and 53na may have substantially the same resistance value to each other because the calibration resistors receive the pull-up calibration code CALU<1:m> in common. The compensation resistors of the first to nth pull-up termination circuits 531a, 532a and 53na may have different resistance values from each other because the compensation resistors are set to have their resistance values based on different compensation signals. A resistance value of a compensation resistor coupled to a pin arranged closer to the first termination voltage terminal 501 may have a greater resistance value while a resistance value of a compensation resistor coupled to a pin arranged farther from the first termination voltage terminal 501 may have a less resistance value. The compensation resistor of the first pull-up termination circuit 531a may have the greatest resistance value and the compensation resistor of the second pull-up termination circuit 532a may have a less resistance value than the compensation resistor of the first pull-up termination circuit 531a. The compensation resistor of the nth pull-up termination circuit 53na may have the least resistance value. The first to nth pull-up termination circuits 531a, 532a and 53na may be set to have different resistance values from each other by setting the compensation resistors of the first to nth pull-up termination circuits 531a, 532a and 53na to have different resistance values from each other. As a distance from the first termination voltage terminal 501 to a pin becomes farther, the parasitic resistance value between the first termination voltage terminal 501 to the pin may become greater. The compensation resistors of the first to nth pull-up termination circuits 531a, 532a and 53na may be set to have different resistance values from each other based on the distances from the first termination voltage terminal 501 to the corresponding pins thereby making the resistance values between the first termination voltage terminal 501 and the first to nth pins 511, 512 and 51n substantially the same as each other.

A composite resistance value of resistors among the first termination voltage terminal 501, the first pull-up termination circuit 531a and the first pin 511 may become substantially the same as a composite resistance value of resistors among the first termination voltage terminal 501, the second pull-up termination circuit 532a and the second pin 512. The composite resistance value of resistors among the first termination voltage terminal 501, the second pull-up termination circuit 532a and the second pin 512 may become substantially the same as a composite resistance value of resistors among the first termination voltage terminal 501, the nth pull-up termination circuit 53na and the nth pin 51n. The composite resistance value of resistors among the first termination voltage terminal 501, the nth pull-up termination circuit 53na and the nth pin 51n may become substantially the same as the composite resistance value of resistors the first termination voltage terminal 501, the first pull-up termination circuit 531a and the first pin 511.

Each of the first to nth pull-down termination circuits 531b, 532b and 53nb may have a reference resistor, a calibration resistor and a compensation resistor. The first pull-down termination circuit 531b may have a reference resistor 11, a calibration resistor and a compensation resistor. The reference resistor 11 of the first pull-down termination circuit 531b may be serially coupled to the first pin 511. The calibration resistor and the compensation resistor of the first pull-down termination circuit 531b may be coupled to each other in parallel, and may be serially coupled to the reference resistor 11. The calibration resistor and the compensation resistor of the first pull-down termination circuit 531b may be serially coupled to the second termination voltage terminal 502. The calibration resistor of the first pull-down termination circuit 531b may receive a pull-down calibration code CALD<1:m>. The calibration resistor of the first pull-down termination circuit 531b may have a variable resistance value varying according to the pull-down calibration code CALD<1:m>. The compensation resistor of the first pull-down termination circuit 531b may receive a first pull-down compensation signal CD1<1:h>. The first pull-down compensation signal CD1<1:h> may be a multi-bit code signal. The compensation resistor of the first pull-down termination circuit 531b may have a variable resistance value varying according to the first pull-down compensation signal CD1<1:h>.

The second pull-down termination circuit 532b may have a reference resistor 12, a calibration resistor and a compensation resistor. The reference resistor 12 of the second pull-down termination circuit 532b may be serially coupled to the second pin 512. The calibration resistor and the compensation resistor of the second pull-down termination circuit 532b may be coupled to each other in parallel, and may be serially coupled to the reference resistor 12. The calibration resistor and the compensation resistor of the second pull-down termination circuit 532b may be serially coupled to the second termination voltage terminal 502. The calibration resistor of the second pull-down termination circuit 532b may receive the pull-down calibration code CALD<1:m>. The calibration resistor of the second pull-down termination circuit 532b may have a variable resistance value varying according to the pull-down calibration code CALD<1:m>. The compensation resistor of the second pull-down termination circuit 532b may receive a second pull-down compensation signal CD2<1:h>. The second pull-down compensation signal CD2<1:h> may be a multi-bit code signal. The compensation resistor of the second pull-down termination circuit 532b may have a variable resistance value varying according to the second pull-down compensation signal CD2<1:h>.

The nth pull-down termination circuit 53nb may have a reference resistor 1n, a calibration resistor and a compensation resistor. The reference resistor 1n of the nth pull-down termination circuit 53nb may be serially coupled to the nth pin 51n. The calibration resistor and the compensation resistor of the nth pull-down termination circuit 53nb may be coupled to each other in parallel, and may be serially coupled to the reference resistor 1n. The calibration resistor and the compensation resistor of the nth pull-down termination circuit 53nb may be serially coupled to the second termination voltage terminal 502. The calibration resistor of the nth pull-down termination circuit 53nb may receive the pull-down calibration code CALD<1:m>. The calibration resistor of the nth pull-down termination circuit 53nb may have a variable resistance value varying according to the pull-down calibration code CALD<1:m>. The compensation resistor of the nth pull-down termination circuit 53nb may receive a nth pull-down compensation signal CDn<1:h>. The nth pull-down compensation signal CDn<1:h> may be a multi-bit code signal. The compensation resistor of the nth pull-down termination circuit 53nb may have a variable resistance value varying according to the nth pull-down compensation signal CDn<1:h>.

The reference resistors 11, 12 and 1n of the first to nth pull-down termination circuits 531b, 532b and 53nb may have substantially the same resistance value to each other. The calibration resistors of the first to nth pull-down termination circuits 531b, 532b and 53nb may have substantially the same resistance value to each other because the calibration resistors receive the pull-down calibration code CALD<1:m> in common. The compensation resistors of the first to nth pull-down termination circuits 531b, 532b and 53nb may have different resistance values from each other because the compensation resistors are set to have their resistance values based on different compensation signals. A resistance value of a compensation resistor coupled to a pin arranged closer to the second termination voltage terminal 502 may have a greater resistance value while a resistance value of a compensation resistor coupled to a pin arranged farther from the second termination voltage terminal 502 may have a less resistance value. The compensation resistor of the first pull-down termination circuit 531b may have the least resistance value and the compensation resistor of the second pull-down termination circuit 532b may have a greater resistance value than the compensation resistor of the first pull-down termination circuit 531b. The compensation resistor of the nth pull-down termination circuit 53nb may have the greatest resistance value. The first to nth pull-down termination circuits 531b, 532b and 53nb may be set to have different resistance values from each other by setting the compensation resistors of the first to nth pull-down termination circuits 531b, 532b and 53nb to have different resistance values from each other. As a distance from the second termination voltage terminal 502 to a pin becomes farther, the parasitic resistance value between the second termination voltage terminal 502 to the pin may become greater. The compensation resistors of the first to nth pull-down termination circuits 531b, 532b and 53nb may be set to have different resistance values from each other based on the distances from the second termination voltage terminal 502 to the corresponding pins thereby making the resistance values between the second termination voltage terminal 502 and the first to nth pins 511, 512 and 51n substantially the same as each other.

A composite resistance value of resistors among the second termination voltage terminal 502, the first pull-down termination circuit 531b and the first pin 511 may become substantially the same as a composite resistance value of resistors among the second termination voltage terminal 502, the second pull-down termination circuit 532b and the second pin 512. The composite resistance value of resistors among the second termination voltage terminal 502, the second pull-down termination circuit 532b and the second pin 512 may become substantially the same as a composite resistance value of resistors among the second termination voltage terminal 502, the nth pull-down termination circuit 53nb and the nth pin 51n. The composite resistance value of resistors among the second termination voltage terminal 502, the nth pull-down termination circuit 53nb and the nth pin 51n may become substantially the same as the composite resistance value of resistors the second termination voltage terminal 502, the first pull-down termination circuit 531b and the first pin 511.

Referring to FIG. 5, the semiconductor apparatus 500 may further include a first receiver (RX1) 541, a second receiver (RX2) 542 and a nth receiver (RXn) 54n. The first receiver 541 may be coupled to the first pin 511 and may receive a signal transferred through the first pin 511. The second receiver 542 may be coupled to the second pin 512 and may receive a signal transferred through the second pin 512. The nth receiver 54n may be coupled to the nth pin 51n and may receive a signal transferred through the nth pin 51n. The signals received by the first to nth receivers 541, 542 and 54n may be provided to internal circuits (not illustrated) of the semiconductor apparatus 500.

The semiconductor apparatus 500 may further include a calibration circuit 550. The calibration circuit 550 may perform a calibration operation while being coupled to an external reference resistor ZQ. For example, one end of the calibration circuit 550 may be coupled to the first power voltage VDDH. The calibration circuit 550 may generate the pull-up calibration code CALU<1:m> by performing the calibration operation. The calibration circuit 550 may generate the pull-down calibration code CALD<1:m> based on the pull-up calibration code CALU<1:m>. The pull-up calibration code CALU<1:m> may be a signal for setting a pull-up resistance value and the pull-down calibration code CALD<1:m> may be a signal for setting a pull-down resistance value.

Figure 6:
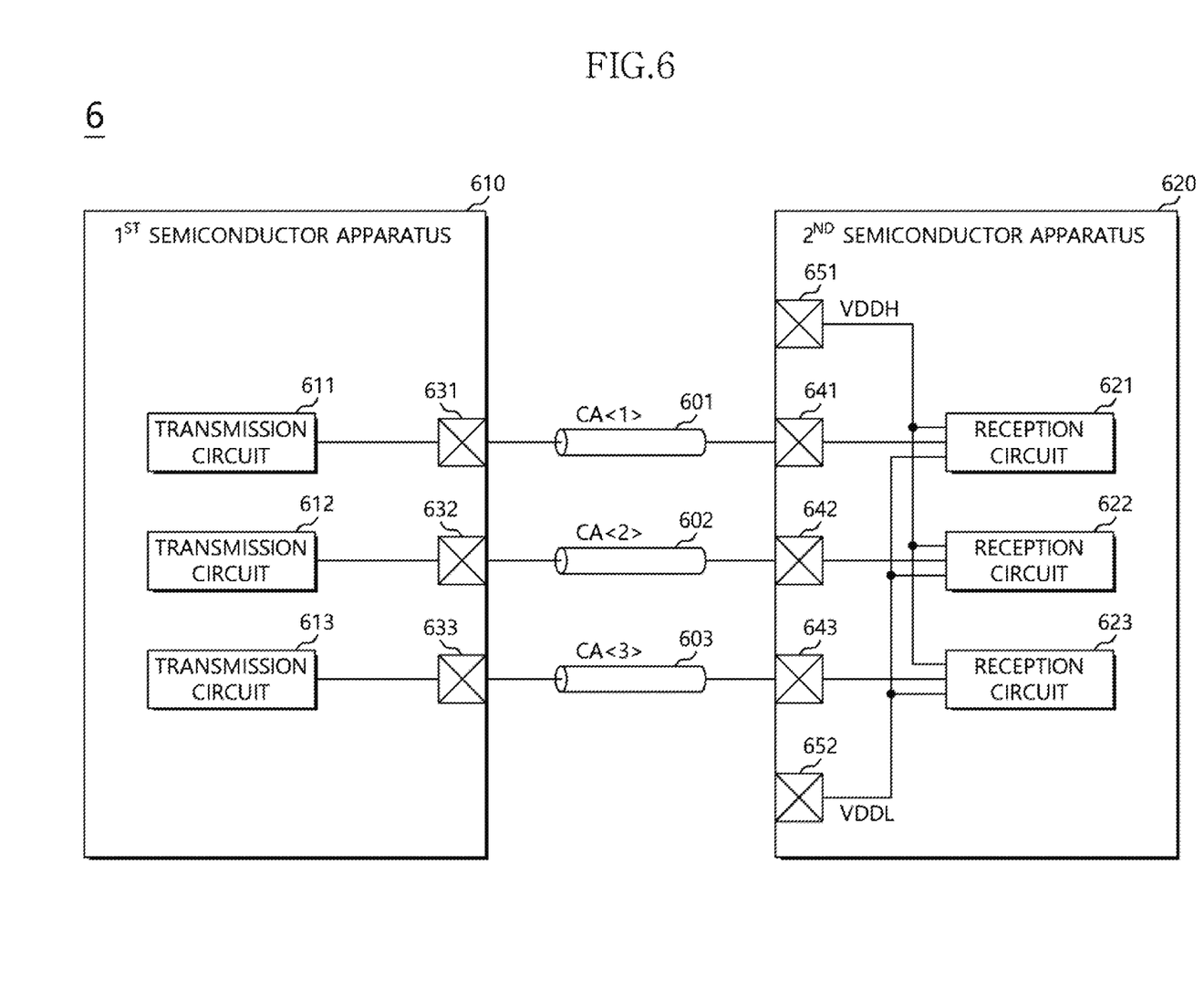
FIG. 6 is a diagram illustrating a configuration of a semiconductor system in accordance with an embodiment of the present disclosure.

FIG. 6 is a diagram illustrating a configuration of a semiconductor system 6 in accordance with an embodiment of the present disclosure. Referring to FIG. 6, the semiconductor system 6 may include a first semiconductor apparatus 610 and a second semiconductor apparatus 620. The first semiconductor apparatus 610 provide various control signals for the second semiconductor apparatus 620 to operate. The first semiconductor apparatus 610 may include various host devices. For example, the first semiconductor apparatus 610 may be a host device such as a central processing unit (CPU), a graphic processing unit (GPU), a multi-media processor (MMP), a digital signal processor, an application processor (AP) and a memory controller. For example, the second semiconductor apparatus 620 may be a memory apparatus. The memory apparatus may include a volatile memory apparatus and a non-volatile memory apparatus. The volatile memory apparatus may include a static random access memory (static RAM: SRAM) and a dynamic RAM (DRAM), a synchronous DRAM (SDRAM). The non-volatile memory apparatus may include a read only memory (ROM), a programmable ROM (PROM), an electrically erasable and programmable ROM (EEPROM), an electrically programmable ROM (EPROM), a flash memory, a phase change RAM (PRAM), a magnetic RAM (MRAM), a resistive RAM (RRAM), a ferroelectric RAM (FRAM) and so forth.

The second semiconductor apparatus 620 may be coupled to the first semiconductor apparatus 610 through a plurality of buses. The plurality of buses may be a signal transmission path, a link or a channel for transferring a signal. The plurality of buses may include a first signal transmission line 601, a second transmission line 602 and a third transmission line 603. Even though each of the first signal transmission line 601, the second transmission line 602 and the third transmission line 603 is, for example, a one-way bus transferring signals from the first semiconductor apparatus 610 to the second semiconductor apparatus 620, each of the first signal transmission line 601, the second transmission line 602 and the third transmission line 603 may be a two-way bus. For example, the first signal transmission line 601, the second transmission line 602 and the third transmission line 603 may configure a command address bus. The first signal transmission line 601 may transfer a first bit CA<1> of a command address signal, the second transmission line 602 may transfer a second bit CA<2> of the command address signal and the third transmission line 603 may transfer a third bit CA<3> of the command address signal.

The first semiconductor apparatus 610 may include a plurality of transmission circuits 611, 612 and 613. The transmission circuit 611 may be coupled to the first signal transmission line 601 through a transmission pad 631 and may transfer the first bit CA<1> of the command address signal to the second semiconductor apparatus 620 through the transmission pad 631 and the first signal transmission line 601. The transmission circuit 612 may be coupled to the second signal transmission line 602 through a transmission pad 632 and may transfer the second bit CA<2> of the command address signal to the second semiconductor apparatus 620 through the transmission pad 632 and the second signal transmission line 602. The transmission circuit 613 may be coupled to the third transmission line 603 through a transmission pad 633 and may transfer the third bit CA<3> of the command address signal to the second semiconductor apparatus 620 through the transmission pad 633 and the third transmission line 603.

The second semiconductor apparatus 620 may include a plurality of reception circuits 621, 622 and 623. The reception circuit 621 may be coupled to the first signal transmission line 601 through a reception pad 641 and may receive the first bit CA<1> of the command address signal provided from the first semiconductor apparatus 610 through the reception pad 641 and the first signal transmission line 601. The reception circuit 622 may be coupled to the second signal transmission line 602 through a reception pad 642 and may receive the second bit CA<2> of the command address signal provided from the first semiconductor apparatus 610 through the reception pad 642 and the second signal transmission line 602. The reception circuit 623 may be coupled to the third transmission line 603 through a reception pad 643 and may receive the third bit CA<3> of the command address signal provided from the first semiconductor apparatus 610 through the reception pad 643 and the third transmission line 603.

The second semiconductor apparatus 620 may further include a first power voltage pad 651 and a second power voltage pad 652. The first power voltage pad 651 may receive a first power voltage VDDH. The second power voltage pad 652 may receive a second power voltage VDDL. Each of the first power voltage pad 651 and the second power voltage pad 652 may be a termination voltage terminal for providing a termination voltage. The reception circuits 621, 622 and 623 may be terminated as matched to impedances of the transmission circuits 611, 612 and 613 in order to reduce reflection occurring on the first signal transmission line 601, the second transmission line 602 and the third transmission line 603 and precisely receive the command address signal CA<1:3> provided from the transmission circuits 611, 612 and 613. The reception circuits 621, 622 and 623 may be terminated through the first power voltage VDDH according to a high tap termination scheme and may be terminated through the second power voltage VDDL according to a low tap termination. Also, the reception circuits 621, 622 and 623 may be terminated through both of the first power voltage VDDH and the second power voltage VDDL according to a center tap termination scheme. The respective reception circuits 621, 622 and 623 may include receivers and termination circuits. The receivers may be configured to receive the command address signal CA<1:3> provided through the reception pads 641, 642 and 643. The termination circuits may be configured to set termination resistance values of the reception circuits 621, 622 and 623 and/or the reception pads 641, 642 and 643. The configurations of the semiconductor apparatuses 100, 300 and 500 of FIGS. 1, 3 and 5 may be applied to the second semiconductor apparatus 620. The first pins 111, 311 and 511, the second pins 112, 312 and 512 and the nth pins 11n, 31n and 51n may correspond to the reception pads 641, 642 and 643, and the plurality of termination circuits 131, 132, 13n, 331, 332, 33n, 531a, 531b, 532a, 532b, 53na and 53nb and the receivers 141, 142, 14n, 341, 342, 34n, 541, 542 and 54n may correspond to the reception circuits 621, 622 and 623.

While certain embodiments have been described above, it will be understood to those skilled in the art that the embodiments described are by way of example only. Accordingly, the termination circuit and semiconductor apparatus using the same should not be limited based on the described embodiments. Rather, the termination circuit and semiconductor apparatus using the same described herein should only be limited in light of the claims that follow when taken in conjunction with the above description and accompanying drawings.

What is claimed is:

1. A semiconductor apparatus comprising:
   a termination voltage terminal;
   a first termination circuit coupled between the termination voltage terminal and a first pin; and
   a second termination circuit coupled between the termination voltage terminal and a second pin,
   wherein resistance values of the first termination circuit and the second termination circuit are determined on a basis of distances from the termination voltage terminal to the first pin and the second pin.

2. The semiconductor apparatus of claim 1, wherein the resistance value of the first termination circuit is set such that a resistance value between the termination voltage terminal and the first pin is substantially the same as a resistance value between the termination voltage terminal and the second pin.

3. The semiconductor apparatus of claim 2, wherein the resistance value of the second termination circuit is set such that a resistance value between the termination voltage terminal and the second pin is substantially the same as a resistance value between the termination voltage terminal and the first pin.

4. The semiconductor apparatus of claim 1, wherein the first termination circuit includes:
   a first reference resistor;
   a first calibration resistor serially coupled to the first reference resistor and having a resistance value varying based on a calibration code; and
   a first compensation resistor coupled to the first calibration resistor in parallel and having a resistance value varying based on a first compensation signal.

5. The semiconductor apparatus of claim 4, wherein the second termination circuit includes:
   a second reference resistor;
   a second calibration resistor serially coupled to the second reference resistor and having a resistance value varying based on the calibration code; and
   a second compensation resistor coupled to the second calibration resistor in parallel and having a resistance value varying based on a second compensation signal.

6. The semiconductor apparatus of claim 5,
   wherein the resistance value of the first compensation resistor is set such that a resistance value between the termination voltage terminal and the first pin is the same as a resistance value between the termination voltage terminal and the second pin, and
   wherein the resistance value of the second compensation resistor is set such that the resistance value between the termination voltage terminal and the first pin is the same as the resistance value between the termination voltage terminal and the second pin.

7. The semiconductor apparatus of claim 5, wherein the resistance values of the first compensation resistor and the second compensation resistor are set on a basis of the distances from the termination voltage terminal to the first pin and the second pin.

8. The semiconductor apparatus of claim 5, wherein the resistance value of the second compensation resistor is less than the resistance value of the first compensation resistor when the distance from the termination voltage terminal to the second pin is farther than the distance from the termination voltage terminal to the first pin.

9. The semiconductor apparatus of claim 1,
   wherein the first pin is coupled to a first signal transmission line which is configured to transfer a first bit of a command address signal, and
   wherein the second pin is coupled to a second signal transmission line which is configured to transfer a second bit of the command address signal.

10. A semiconductor apparatus comprising:
    a termination voltage terminal;
    a plurality of pins disposed as sequentially farther from the termination voltage terminal; and
    a plurality of termination circuits coupled between the termination voltage terminal and the plurality of pins in a one-to-one manner,
    wherein the plurality of termination circuits have different resistance values based on distances from the termination voltage terminal to the plurality of pins.

11. The semiconductor apparatus of claim 10, wherein the plurality of termination circuits are set to have a lesser resistance value as the plurality of pins, to which the plurality of termination circuits are coupled, are disposed farther from the termination voltage terminal.

12. The semiconductor apparatus of claim 10, wherein the plurality of termination circuits are set to have a greater resistance value as the plurality of pins, to which the plurality of termination circuits are coupled, are disposed closer to the termination voltage terminal.

13. The semiconductor apparatus of claim 10,
    wherein the plurality of pins are coupled to signal transmission lines in a one-to-one manner to transfer bits of a command address signal.

14. A semiconductor apparatus comprising:
    a first termination voltage terminal configured to receive a first power voltage;
    a second termination voltage terminal configured to receive a second power voltage having a lower level than the first power voltage;
    a first pull-up termination circuit coupled between the first termination voltage terminal and a first pin and having a resistance value varying based on a first pull-up compensation signal;
    a first pull-down termination circuit coupled between the second termination voltage terminal and the first pin and having a resistance value varying based on a first pull-down compensation signal;
    a second pull-up termination circuit coupled between the first termination voltage terminal and a second pin and having a resistance value varying based on a second pull-up compensation signal; and
    a second pull-down termination circuit coupled between the second termination voltage terminal and the second pin and having a resistance value varying based on a second pull-down compensation signal.

15. The semiconductor apparatus of claim 14,
    wherein the first pin and the second pin are sequentially disposed between the first termination voltage terminal and the second termination voltage terminal, and
    wherein the resistance value of the first pull-up termination circuit is set as greater than the resistance value of the second pull-up termination circuit.

16. The semiconductor apparatus of claim 15, wherein the resistance value of the first pull-down termination circuit is set as less than the resistance value of the second pull-down termination circuit.

17. The semiconductor apparatus of claim 14, wherein a composite resistance value of parasitic resistors formed among the first pull-up termination circuit, the first termination voltage terminal and the first pin is substantially the same as a composite resistance value of parasitic resistors formed among the second pull-up termination circuit, the first termination voltage terminal and the second pin.

18. The semiconductor apparatus of claim 14, wherein a composite resistance value of parasitic resistors formed among the first pull-down termination circuit, the second termination voltage terminal and the first pin is substantially the same as a composite resistance value of parasitic resistors formed among the second pull-down termination circuit, the second termination voltage terminal and the second pin.

* * * * *